(12) United States Patent
Haney et al.

(10) Patent No.: US 8,445,917 B2
(45) Date of Patent: May 21, 2013

(54) BIDIRECTIONAL SILICON CARBIDE TRANSIENT VOLTAGE SUPPRESSION DEVICES

(75) Inventors: Sarah Kay Haney, Cary, NC (US); Sei-Hyung Ryu, Cary, NC (US)

(73) Assignee: Cree, Inc., Durham, NC (US)

( * ) Notice: Subject to any disclaimer, the term of this patent is extended or adjusted under 35 U.S.C. 154(b) by 455 days.

(21) Appl. No.: 12/408,167

(22) Filed: Mar. 20, 2009

(65) Prior Publication Data
US 2010/0237356 A1 Sep. 23, 2010

(51) Int. Cl.
*H01L 29/15* (2006.01)
*H01L 29/861* (2006.01)

(52) U.S. Cl.
USPC .............. 257/77; 257/481; 257/551

(58) Field of Classification Search
USPC ............ 257/77, 106, 175, 199, 481, 551, 257/E21.355, E21.356, E29.335
See application file for complete search history.

(56) References Cited

U.S. PATENT DOCUMENTS

| | | | |
|---|---|---|---|
| 4,174,530 A | 11/1979 | Kresge et al. | |
| 4,980,315 A | 12/1990 | Einthoven et al. | |
| 5,166,769 A | 11/1992 | Einthoven et al. | |
| 5,233,214 A | 8/1993 | Gorlach et al. | |
| 5,528,064 A | 6/1996 | Thiel et al. | |
| 5,539,604 A | 7/1996 | Clark et al. | |
| 5,760,450 A | 6/1998 | Hurkx et al. | |
| 5,880,511 A | 3/1999 | Yu et al. | |
| 6,489,660 B1 | 12/2002 | Einthoven et al. | |
| 6,515,345 B2 | 2/2003 | Robb et al. | |
| 7,244,970 B2 | 7/2007 | Cogan et al. | |
| 7,279,724 B2 | 10/2007 | Collins, III et al. | |
| 7,339,776 B1 | 3/2008 | Hertel et al. | |
| 2003/0042538 A1 | 3/2003 | Kumar et al. | |

FOREIGN PATENT DOCUMENTS

EP 1 189 286 A1 3/2002
WO WO 2008/093789 A1 8/2008

OTHER PUBLICATIONS

Vassilevski et al., "Low Voltage Silicon Carbide Zener Diode", Trans Tech Publications, Switzerland, 2004, 4 pages.
Wikipedia, Transient voltage suppression diode, 2 pages, admitted prior art.
"Transient Suppression Devices and Principles", Littelfuse, Inc., Application Note, Jan. 1998, 8 pages.
Lepkowski, Jim, "An Introduction to Transient Voltage Suppression Devices," Semiconductor Components Industries, LLC, Jul. 2005, 8 pages.
Hartwig, Bruce, "What Is A Silicon Transient Voltage Suppressor and How Does It Work?" Vishay Semiconductors, Mar. 1, 2004, 2 pages.
Singh et al., "SiC Power Schottky Diodes in Power Factor Correction Circuits," Cree Application Note, 2002, 9 pages.

(Continued)

*Primary Examiner* — Hung Vu
(74) *Attorney, Agent, or Firm* — Myers Bigel Sibley & Sajovec, PA

(57) ABSTRACT

An electronic device includes a silicon carbide layer having a first conductivity type and having a first surface and a second surface opposite the first surface, and first and second silicon carbide Zener diodes on the silicon carbide layer. Each of the first and second silicon carbide Zener diodes may include a first heavily doped silicon carbide region having a second conductivity type opposite the first conductivity type on the silicon carbide layer, and an ohmic contact on the first heavily doped silicon carbide region.

20 Claims, 10 Drawing Sheets

OTHER PUBLICATIONS

Ishii R. et al.: "20B-400A SiC Zener Diodes with Excellent Temperature Coefficient", Proceedings of the 19th International Symposium on Power Semiconductor Devices & ICs; May 27-30, 2007 Jeju, Korea, pp. 277-280, XP031129722.

Vassilevski K V, et al.: "Low Voltage Silicon Carbide Zener Diode", Materials Science Forum vols. 457-460 (2004) pp. 1029-1032; Online at http://www.scientific.net, 2004 Trans Tech Publications, Switzerland.

Notification of Transmittal of the International Search Report and the Written Opinion of the International Searching Authority, or the Declaration; International Search Report; Written Opinion of the International Searching Authority corresponding to International application No. PCT/US/2010/020691; Date of mailing: Apr. 5, 2010; 15 pages.

International Preliminary Report on Patentability corresponding to International Application No. PCT/US/2010/020691; Date of Mailing: Mar. 31, 2011; 15 pages.

BIDIRECTIONAL SILICON CARBIDE TRANSIENT VOLTAGE SUPPRESSION DEVICES

STATEMENT OF U.S. GOVERNMENT INTEREST

This invention was made with Government support under Contract No. W911NF-04-2-0022 awarded by Army Research Laboratories. The Government has certain rights in the invention.

FIELD OF THE INVENTION

The present invention relates to silicon carbide-based devices. In particular, the present invention relates to silicon carbide devices for transient voltage suppression.

BACKGROUND

A transient voltage suppressor, or TVS, is a device that is employed to reduce the effects of temporary overvoltage conditions in an electronic circuit. For example, some TVS devices attenuate voltage spikes, while other TVS devices are designed to divert excessive voltages to ground. A common device used for transient voltage suppression is a transient voltage suppression diode, which is typically used for unidirectional or bidirectional electrostatic discharge protection of transmission or data lines in electronic circuits. TVS devices can also be used to protect against overvoltages being applied to the gate of a power MOSFET. An overvoltage on the gate of a MOSFET can damage or destroy the gate dielectric of the MOSFET, potentially leading to device failure. A transient voltage suppression diode may be implemented simply using a Zener diode placed in parallel with a load that is to be protected.

A unidirectional TVS protects against overvoltages having a single (positive or negative) polarity, while a bidirectional TVS protects against overvoltages having positive and/or negative polarity.

Silicon carbide has been proposed as a possible material for transient voltage suppressors for low voltage applications, such as protection of low voltage power lines. See, e.g., K. V. Vassilevski, et al., "Low Voltage Silicon Carbide Zener Diode," Materials Science Forum, vols. 457-460, pp. 1029-1032 (2004). However, as noted therein, at voltages below 50 V, the advantages of silicon carbide may be overshadowed by high contact and substrate resistivities. Furthermore, the Zener diodes described in Vassilevski had a positive breakdown voltage temperature coefficient and were described as having mixed Zener and avalanche breakdown characteristics.

SUMMARY

An electronic device according to some embodiments includes a silicon carbide layer having a first conductivity type and having a first surface and a second surface opposite the first surface, and first and second silicon carbide Zener diodes on the silicon carbide layer. Each of the first and second silicon carbide Zener diodes may include a first heavily doped silicon carbide region having a second conductivity type opposite the first conductivity type on the silicon carbide layer, and an ohmic contact on the first heavily doped silicon carbide region.

The silicon carbide layer may include a bulk silicon carbide substrate and/or an epitaxial layer. The silicon carbide layer may have a thickness less than about 200 µm, and may have a doping concentration of about $5 \times 10^{18}$ cm$^{-3}$ or more.

The first heavily doped silicon carbide region is p-type with a doping concentration of about $5 \times 10^{18}$ cm$^{-3}$ or more.

The first heavily doped silicon carbide regions may include first heavily doped silicon carbide epitaxial layers, and each of the silicon carbide Zener diodes may further include a second heavily doped silicon carbide epitaxial layer having the first conductivity type. The second heavily doped silicon carbide epitaxial layer is between the silicon carbide layer and the first heavily doped silicon carbide epitaxial layer and forms a Zener junction with the first heavily doped silicon carbide epitaxial layer.

The second heavily doped silicon carbide epitaxial layer may be n-type with a doping concentration of about $1 \times 10^{19}$ cm$^{-3}$ or more.

The electronic device may further include an ohmic contact layer on the silicon carbide layer opposite the first and second silicon carbide Zener diodes.

At least one of the first heavily doped silicon carbide regions may have an increased doping concentration near the ohmic contact thereon.

The first and second silicon carbide Zener diodes may include mesas on the silicon carbide layer, and the first heavily doped silicon carbide regions include first heavily doped silicon carbide epitaxial layers on the silicon carbide layer. The mesas may each have a cross sectional area of about 0.25 mm$^2$ or more.

The silicon carbide layer may include a bulk silicon carbide substrate, and the mesas may extend completely through the first heavily doped silicon carbide epitaxial layers and into the silicon carbide substrate.

The mesas may extend completely through the first heavily doped silicon carbide epitaxial layers and into but not completely through the silicon carbide layer. In some embodiments, the mesas may extend completely through the first heavily doped silicon carbide epitaxial layers and completely through the silicon carbide layer.

Each of the first and second Zener diodes may have a Zener breakdown voltage that is less than 20V. Furthermore, each of the first and second Zener diodes may have a negative breakdown voltage temperature coefficient.

In some embodiments, the first heavily doped silicon carbide regions include implanted regions in the silicon carbide layer.

Methods of forming an electronic device according to some embodiments include providing a first conductivity type silicon carbide substrate, forming two silicon carbide Zener diodes on the silicon carbide substrate, the silicon carbide substrate provides a common cathode for the silicon carbide Zener diodes, forming first and second ohmic contacts on the mesas opposite the substrate, and forming a third ohmic contact on the silicon carbide substrate.

Forming the two silicon carbide Zener diodes may include providing a second conductivity type silicon carbide epitaxial layer on the first conductivity type silicon carbide substrate, and etching through the second conductivity type silicon carbide epitaxial layer to form a pair of mesas that define respective Zener junctions.

The methods may further include providing a first conductivity type silicon carbide epitaxial layer on the silicon carbide substrate. The second conductivity type silicon carbide epitaxial layer may be formed on the first conductivity type silicon carbide epitaxial layer. Etching the second conductivity type silicon carbide epitaxial layer to form the pair of mesas may include etching into the first conductivity type silicon carbide epitaxial layer.

Etching the second conductivity type silicon carbide epitaxial layer to form the pair of mesas may include etching through the first conductivity type silicon carbide epitaxial layer into the silicon carbide substrate.

The methods may further include thinning the n-type silicon carbide substrate to a thickness of less than about 200 μm.

Forming the silicon carbide Zener diodes may include forming an implant mask including a pair of spaced apart openings on the silicon carbide substrate, implanting second conductivity type ions through the implant mask, and annealing the substrate to activate the implanted ions.

Forming the implant mask may include forming the implant mask on the substrate, and implanting the second conductivity type ions may include implanting the second conductivity type ions into the substrate to form second conductivity regions in the substrate, the second conductivity regions having a net doping concentration greater than about $5 \times 10^{18}$ cm$^{-3}$ and forming Zener junctions with the substrate.

The methods may further include forming a first conductivity type silicon carbide epitaxial layer on the substrate, and forming the implant mask may include forming the implant mask on the first conductivity type silicon carbide epitaxial layer, implanting the second conductivity type ions may include implanting the second conductivity type ions into the first conductivity type silicon carbide epitaxial layer to form second conductivity regions in the first conductivity type silicon carbide epitaxial layer. The second conductivity regions may have a net doping concentration greater than about $5 \times 10^{18}$ cm$^{-3}$ and may form Zener junctions with the first conductivity type silicon carbide epitaxial layer.

An electronic device according to some embodiments includes a silicon carbide layer having a first conductivity type and having a first surface and a second surface opposite the first surface, first and second silicon carbide Zener diodes on the silicon carbide layer, each of the first and second silicon carbide Zener diodes may include a heavily doped silicon carbide epitaxial layer having a second conductivity type opposite the first conductivity type, and first and second ohmic contacts, respectively, on the heavily doped silicon carbide epitaxial layers of the first and second silicon carbide Zener diodes opposite the silicon carbide layer.

Each of the first and second Zener diodes may have a Zener breakdown voltage that is less than 20V.

An electronic circuit according to some embodiments includes a silicon carbide metal oxide semiconductor field effect transistor (MOSFET) including a gate contact, a drain contact and a source contact, and a silicon carbide based bidirectional transient voltage suppressor (TVS) coupled between the gate and source contacts of the silicon carbide MOSFET, the silicon carbide based TVS including a silicon carbide layer having a first conductivity type and having a first surface and a second surface opposite the first surface, and first and second silicon carbide Zener diodes on the silicon carbide layer, each of the first and second silicon carbide Zener diodes may include a first heavily doped silicon carbide region having a second conductivity type opposite the first conductivity type on the silicon carbide layer, and an ohmic contact on the first heavily doped silicon carbide region.

DETAILED DESCRIPTION

Figure 1:
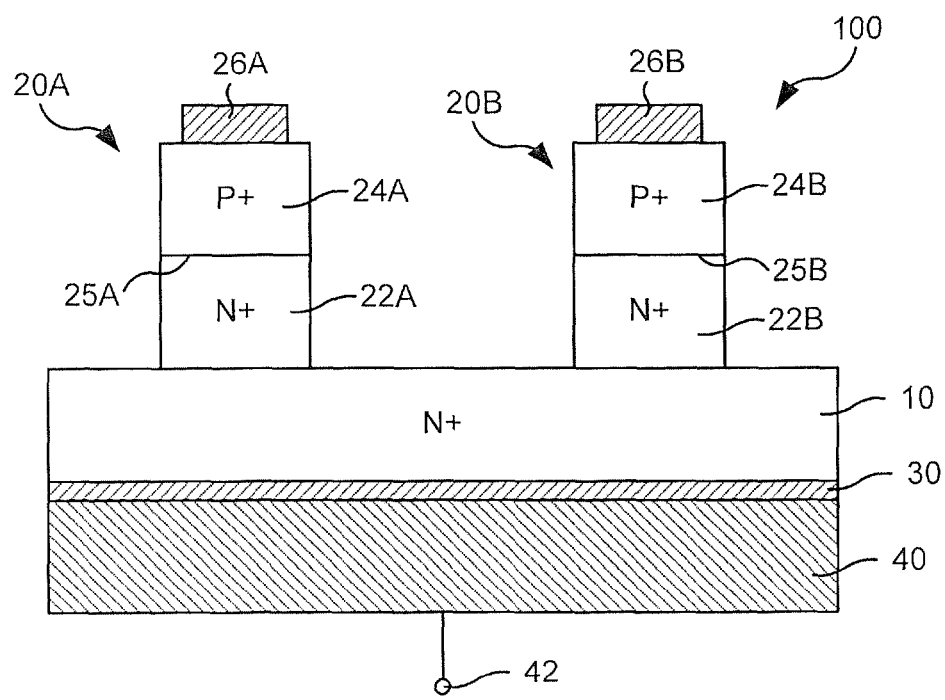
FIG. 1 is a schematic cross-sectional drawing illustrating a bidirectional transient voltage suppression device according to some embodiments.

The present invention now will be described more fully hereinafter with reference to the accompanying drawings, in which various embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. Accordingly, the present invention is not limited to the relative size and spacing illustrated in the accompanying figures. As will also be appreciated by those of skill in the art, references herein to a layer formed "on" a substrate or other layer may refer to the layer formed directly on the substrate or other layer or on an intervening layer or layers formed on the substrate or other layer. Moreover, it will be understood that when a first element or layer is described as "in electrical contact" with a second element or layer, the first and second elements or layers need not be in direct physical contact with one another, but may be connected by intervening conductive elements or layers which permit current flow between the first and second elements or layers.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

As noted above, transient voltage suppression (TVS) devices protect electronic circuits against overvoltage conditions. However, conventional TVS devices may not be well suited for use in connection with silicon carbide based electronic devices.

Silicon carbide (SiC) has been known for many years to have excellent physical and electronic properties which should theoretically allow production of electronic devices that can operate at higher temperatures, higher power and higher frequency than devices produced from silicon (Si) or GaAs. The high electric breakdown field of about $4 \times 10^6$ V/cm, high saturated electron drift velocity of about $2.0 \times 10^7$ cm/sec and high thermal conductivity of about 4.9 W/cm-K indicate that SiC would be suitable for high frequency, high power applications. However, SiC has not generally been considered ideal for use in a TVS device, because of the relatively high drift resistance of SiC, which can increase the Zener impedance of a Zener-diode based TVS device. Zener impedance is the differential resistance of a Zener diode based TVS device after the onset of current conduction. For better performance of the TVS device, it is desirable to reduce the Zener impedance of the device.

Conventional silicon TVS devices are limited in the range of voltages they can handle due to the small bandgap of silicon. Thus, to provide for 15-20 Volts of protection, which may be required, for example, for protecting the gate of a silicon carbide based MOSFET, it may be necessary to connect several silicon based devices in series, which can increase circuit complexity and fabrication expense. Furthermore, silicon based TVS devices may be unable to withstand the high operating temperatures at which silicon carbide based devices can operate. For example, silicon based TVS devices typically have a maximum junction temperature of 185° C. In contrast, the operating temperature of a 4H—SiC MOSFET device can exceed 200° C. Thus, a circuit design must take into account the temperature limitations of a silicon-based TVS device so that the maximum operating temperature of the TVS device is not exceeded. However, it is generally preferable to place a TVS device as physically close to the device that it is protecting as possible.

Some embodiments of the invention provide silicon carbide based transient voltage suppression devices using silicon carbide. In particular, some embodiments provide bidirectional silicon carbide based TVS devices having reduced Zener impedance.

Figure 2:
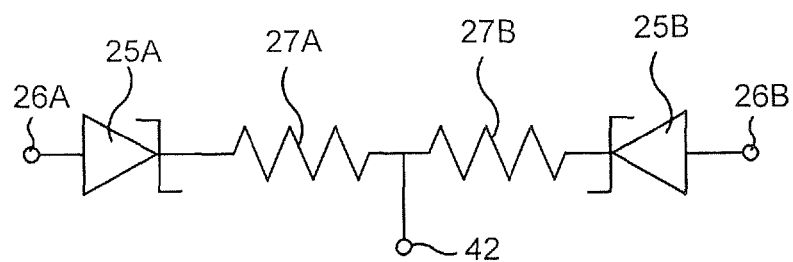
FIG. 2 is an equivalent circuit diagram of a bidirectional transient voltage suppression device according to some embodiments.

Referring to FIG. 1, a silicon carbide based bidirectional transient voltage suppressor (TVS) 100 is illustrated. FIG. 2 is a schematic equivalent circuit of the TVS 100. Referring to FIGS. 1 and 2, the TVS 100 includes an n+ substrate 10 on which a pair of silicon carbide Zener diodes 20A, 20B are provided. The n+ substrate 10 can include 4H—SiC, although other polytypes of SiC, such as 6H, 3C or 15R can be used. In some embodiments, the substrate 10 may include bulk silicon carbide. However, in other embodiments, the substrate 10 can include epitaxial silicon carbide.

The Zener diodes 20A, 20B may be provided in the form of mesas, as illustrated in FIG. 1. Alternatively, the Zener diodes 20A, 20B can be isolated by other methods, such as implant isolation. The Zener diodes 20A, 20B include respective n+ layers 22A, 22B in contact with the substrate 10 and p+ layers 24A, 24B forming respective Zener junctions 25A, 25B with the n+ layers 22A, 22B. The p+ layers 24A, 24B are separated from the substrate 10 by the respective n+ layers 22A, 22B.

The n+ layers 22A, 22B may have a thickness of about 1 µm, while the p+ layers 24A, 24B may have a thickness of about 1.5 µm.

The Zener junctions 25A, 25B may have respective areas of about 2500 µm² or more. In particular embodiments, the Zener junctions 25A, 25B may have dimensions of 500 µm×500 µm, corresponding to areas of about 250,000 µm². A Zener junction 25A, 25B according to some embodiments may be capable of handling a current density greater than 1000 A/cm². Accordingly, a TVS 100 according to some embodiments may be capable of handling currents of up to 2.6 A or more, depending on the area of the Zener junctions 25A, 25B. Furthermore, a Zener junction 25A, 25B according to some embodiments may have a Zener breakdown voltage $V_Z$ between 15V and 20V.

Zener diode operation is based on Zener breakdown, which is a phenomenon that can occur across a junction between highly doped p- and n-type semiconductor layers. In Zener breakdown, when a heavily doped junction is reverse biased with a sufficient voltage, the energy barrier separating mobile carriers in one layer from empty states in the other layer becomes very narrow, permitting carriers to "tunnel" through the barrier and into the empty states, which results in current flow through the reverse biased junction. Such breakdown may occur in a controlled manner that does not damage the junction. It is therefore desirable for a transient voltage suppression device to utilize Zener breakdown for reverse bias conduction. Zener breakdown tends to occur at lower absolute voltages when the operating temperature of the device is elevated. Accordingly, a Zener diode may be characterized by having a negative temperature coefficient (β) in breakdown voltage.

The n+ layers 22A, 22B may include 4H—SiC grown epitaxially on the substrate 10 and doped with n-type dopants, such as nitrogen, at a concentration of about $1 \times 10^{18}$ cm$^{-3}$ or more. In some embodiments, the n+ layers 22A, 22B may have a doping concentration of $5 \times 10^{18}$ cm$^{-3}$ or greater, and in some embodiments may have a doping concentration of $2 \times 10^{19}$ cm$^{-3}$.

The p+ layers 24A, 24B may include 4H—SiC grown epitaxially on the respective n+ layers 22A, 22B and doped with p-type dopants, such as aluminum and/or boron, at a concentration of about $1 \times 10^{19}$ cm$^{-3}$ or more. In some embodiments, the p+ layers 24A, 24B may have a doping concentration of $5 \times 10^{19}$ cm$^{-3}$ or greater, and in some embodiments may have a doping concentration of about $1 \times 10^{20}$ cm$^{-3}$. In some embodiments, the p+ layers 24A, 24B may have a higher doping concentration near an ohmic contact 26A, 26B formed thereon. For example, the p+ layers 24A, 24B may have doping concentrations of $1 \times 10^{20}$ cm$^{-3}$ near the ohmic contacts 26A, 26B, and the doping concentrations may decrease to $5 \times 10^{19}$ cm$^{-3}$ for the remainder of the layers closer to the junctions 25A, 25B.

The doping of the n+ layers 22A, 22B and the p+ layers 24A, 24B may determine the breakdown voltages of the respective Zener diodes 20A, 20B.

Respective ohmic contacts 26A, 26B are formed on the p+ layers 24A, 24B opposite the n+ layers 22A, 22B. Furthermore, an ohmic contact 30 is formed on the substrate 10 opposite the Zener diodes 20A, 20B. A backside metallization 40 including, for example, a Ti/TiW/Au structure, can be formed on the substrate 10. A reference contact 42 can be made to the TVS 100 through the backside metallization 40.

The resistance of the substrate 10, which contributes to the Zener impedance of the TVS 100, is represented in FIG. 2 by the resistances 27A, 27B. To reduce the Zener impedance of the TVS 100, the substrate 10 can be thinned to a thickness of less than about 400 µm. In some embodiments, the substrate 10 can be thinned to a thickness of less than 200 µm. In some embodiments, the substrate 10 can be thinned to a thickness of less than 100 µM, and in some embodiments the substrate 10 can be thinned to a thickness of 10 µm. The substrate 10 can be thinned, for example, by mechanical polishing, grinding, etching, and/or a combination thereof. In some embodiments, the substrate 10 can be thinned prior to formation of the ohmic contact 30 thereon.

Figure 3A:
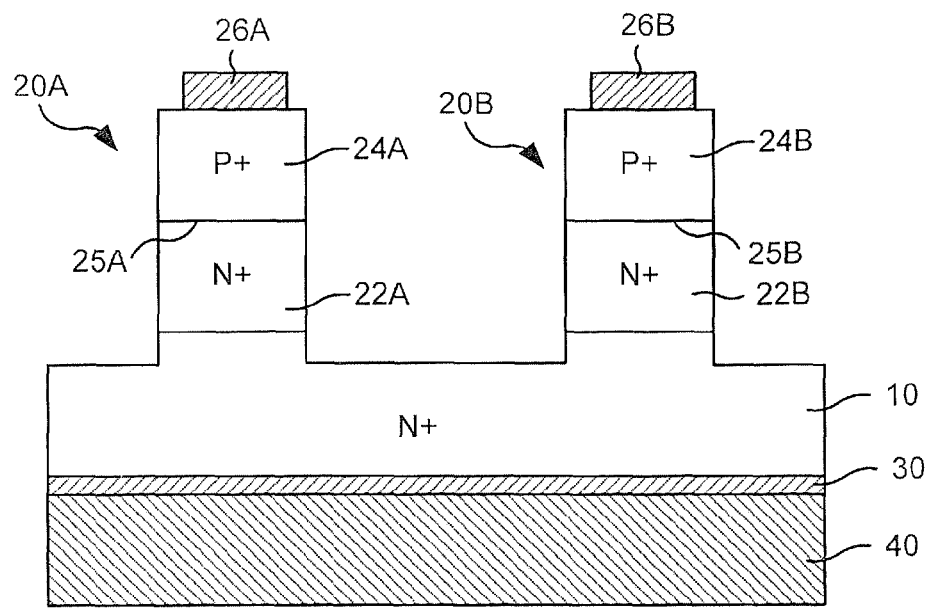
FIGS. 3A-3B are schematic cross-sectional drawings illustrating bidirectional transient voltage suppression device according to further embodiments.
Figure 3B:
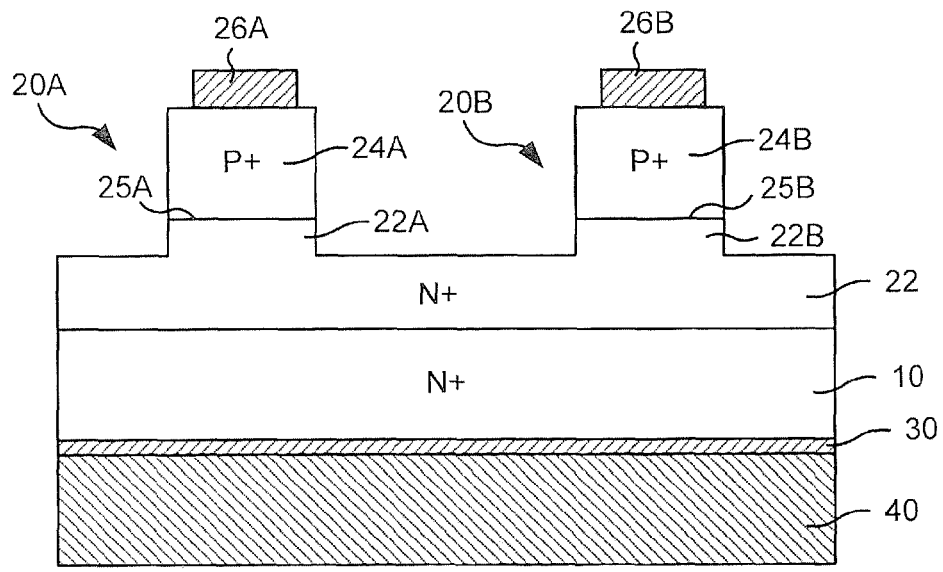

Further embodiments are illustrated in FIGS. 3A and 3B. As illustrated in FIG. 3A, in some embodiments, the Zener diodes 20A, 20B may include mesas that extend through the n+ layers 22A, 22B and partially into the substrate 10. Referring to FIG. 3B, in some embodiments, the mesas may extend into, but not through an n+ layer 22 in which the n+ layers 22A, 22B are defined.

Figure 4A:
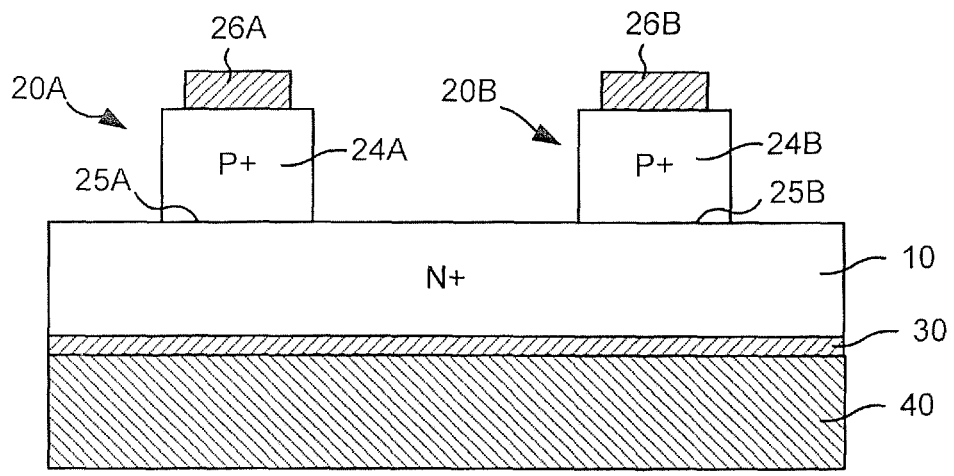
FIGS. 4A-4B are schematic cross-sectional drawings illustrating bidirectional transient voltage suppression device according to further embodiments.
Figure 4B:
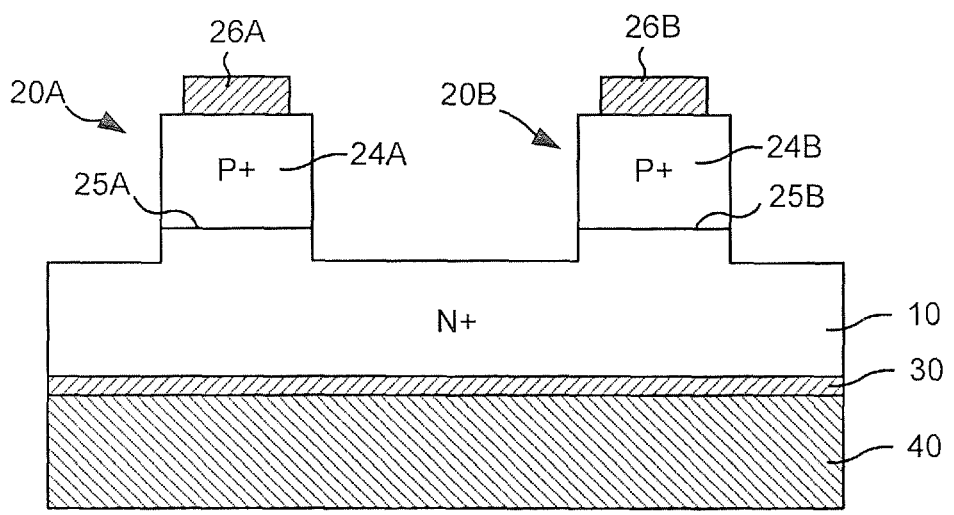

Further embodiments are illustrated in FIGS. 4A and 4B. As shown therein, separate n+ layers s can be omitted, and the Zener junctions 25A, 25B can be formed directly between the p+ layers 24A, 24B and the substrate 10. Furthermore, as shown in FIG. 4B, the Zener diodes 20A, 20B can be formed as mesas that extend completely through the p+ layers 24A, 24B and into the substrate 10.

Figure 5:
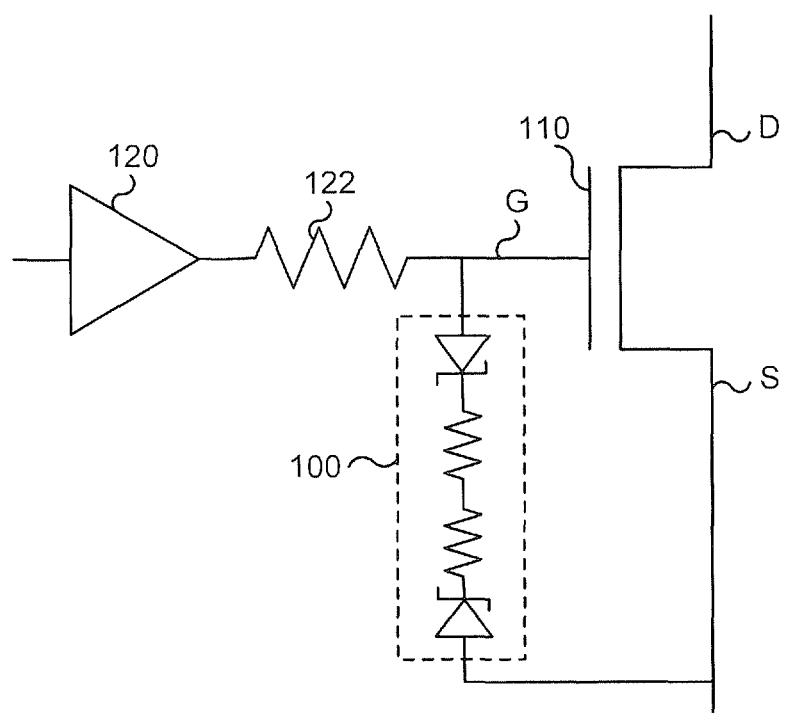
FIG. 5 is an equivalent circuit diagram of a bidirectional transient voltage suppression device according to some embodiments employed to protect a gate of a MOSFET device.

An exemplary application of a silicon carbide based TVS 100 is illustrated in the schematic circuit diagram of FIG. 5. As shown therein, a TVS 100 according to some embodiments can be connected in parallel with a gate contact G of a silicon carbide MOSFET 110. An input signal is applied to the SiC MOSFET 110 by an input drive unit 120 having an input resistance 122. If the voltage applied by the input drive unit 120 experiences a voltage spike, TVS 100 starts to conduct, and the energy of the spike is dissipated through the TVS 100, bypassing the sensitive gate of the MOSFET 110. In particular, a single TVS 100 according to some embodiments can clamp the input voltage level of the MOSFET 110 to +/−18V. Furthermore, because the TVS 100 can operate at elevated temperatures, the TVS 100 can be mounted and/or formed very close to the MOSFET 110. The TVS 100 can therefore provide a substantial improvement of reliability of power systems and power MOSFETs operating at high junction temperatures and/or high ambient temperatures. In some embodiments, the TVS 100 and the MOSFET 110 can be integrated onto a common substrate.

Figure 6:
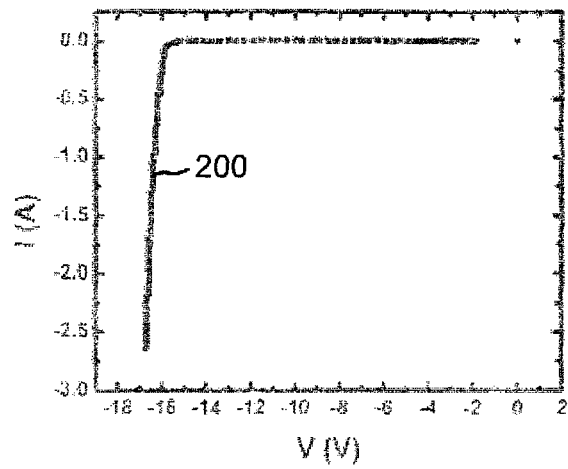
FIGS. 6 and 7 are graphs illustrating some current-voltage characteristics of bidirectional transient voltage suppression devices according to some embodiments.
Figure 7:
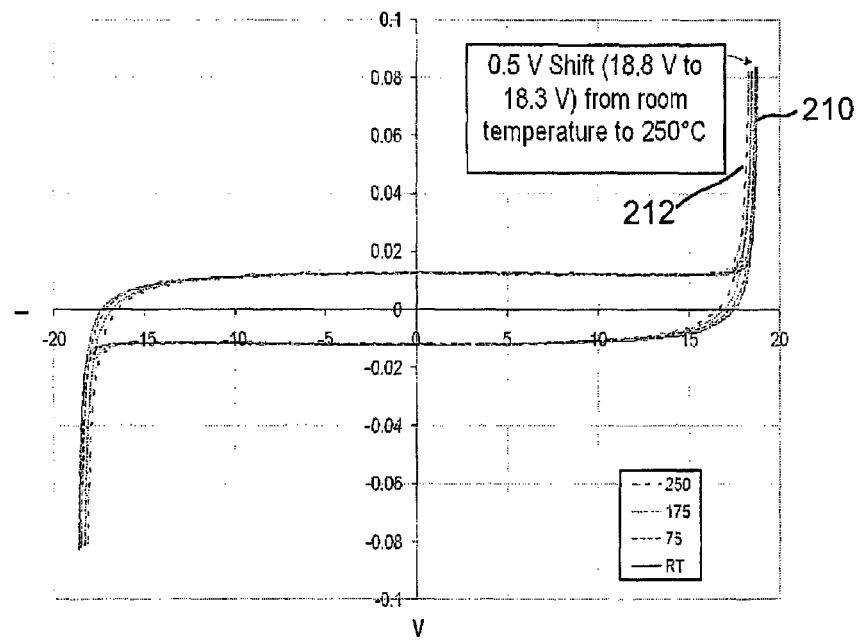

FIGS. 6 and 7 are graphs illustrating some current-voltage characteristics of bidirectional transient voltage suppression devices according to some embodiments. For example, FIG. 6 illustrates the current-voltage characteristics 200 from a first contact 26A to the reference contact 42 on a device having a Zener junction area of about 500 µm×500 µm, or about 0.25 mm². The characteristics illustrated in FIG. 6 show that the device had an operational voltage of approximately 16V and was capable of currents greater than 2.6 A, corresponding to a current density of 1040 A/cm².

FIG. 7 illustrates the temperature dependency of the current-voltage characteristics of a TVS 100 according to some embodiments. In particular, FIG. 7 illustrates the end-to-end current voltage characteristics of a bidirectional TVS 100 according to some embodiments at room temperature (curve 210) and at an elevated temperature of 250° C. (curve 212). The voltage protection of the TVS 100 dropped slightly from 18.8 volts to 18.3 volts when the temperature was raised to 250° C., meaning that the devices exhibited a negative temperature coefficient (β) in breakdown voltage. This behavior indicates that the voltage clamping in the SiC-based TVS 100 is based primarily on Zener breakdown, or band-to-band tunneling, as opposed to avalanche breakdown. The voltage change of 0.5V suggests that a TVS 100 according to embodiments of the present invention can also function as a high temperature voltage reference.

Figure 8A:
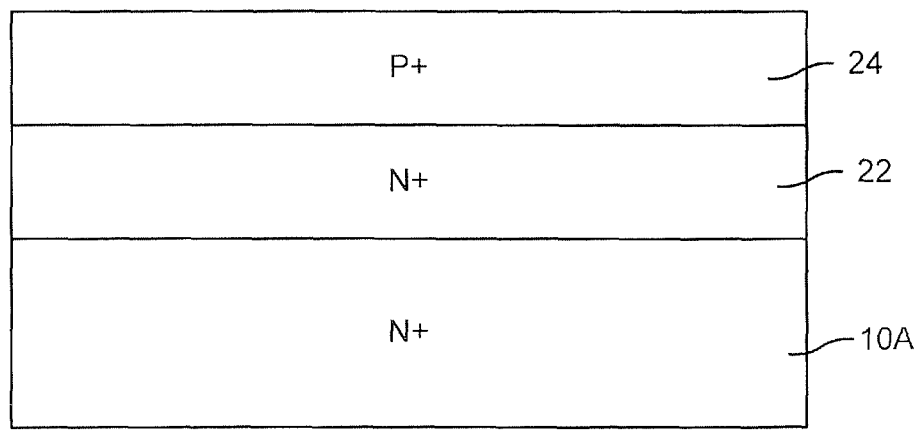
FIG. 8A to 8D are schematic cross-sectional drawings illustrating methods of forming bidirectional transient voltage suppression devices according to some embodiments.

FIGS. 8A to 8D illustrate the formation of a SiC TVS 100 according to some embodiments. Referring to FIG. 8A, an n+ SiC substrate 10A is provided. The substrate 10A may include a bulk 4H—SiC substrate available from Cree, Inc., assignee of the present invention, that is doped with n-type dopants, such as silicon or arsenic, at a concentration of about $5 \times 10^{18}$ cm$^{-3}$ or more. The substrate 10A may have a thickness of about 250 µm to about 500 µm. An n+ epitaxial layer 22 is formed on the n+ substrate 10A, and a p+ epitaxial layer 24 is formed on the n+ epitaxial layer. The epitaxial layers may be formed, for example, using chemical vapor deposition. Epitaxial growth of silicon carbide is well known in the art.

The n+ epitaxial layer 22 may have a thickness of about 1 µm and may be doped with n-type dopants, such as nitrogen, at a concentration of about $5 \times 10^{18}$ cm$^{-3}$ or more. In some embodiments, the n+ epitaxial layer 22 may have a doping concentration of $1 \times 10^{19}$ cm$^{-3}$ or greater, and in some embodiments may have a doping concentration of $2 \times 10^{19}$ cm$^{-3}$.

The p+ epitaxial layer 24 may have a thickness of about 1.5 µm and may be doped with p-type dopants, such as aluminum or boron, at a concentration of about $1 \times 10^{19}$ cm$^{-3}$ or more. In some embodiments, the p+ epitaxial layer 24 may have a doping concentration of $5 \times 10^{19}$ cm$^{-3}$ or greater, and in some embodiments may have a doping concentration of $1 \times 10^{20}$ cm$^{-3}$. The doping of the p+ epitaxial layer 24 may be increased near a surface of the p+ epitaxial layer 24 opposite the n+ epitaxial layer 22. For example, the p+ epitaxial layer 24 may have a doping concentration of $5 \times 10^{19}$ cm$^{-3}$ at the junction with the n+ epitaxial layer 22, and the doping concentration may increase to $1 \times 10^{20}$ cm$^{-3}$ near the surface of the p+ epitaxial layer 24 opposite the n+ epitaxial layer 22.

Figure 8B:
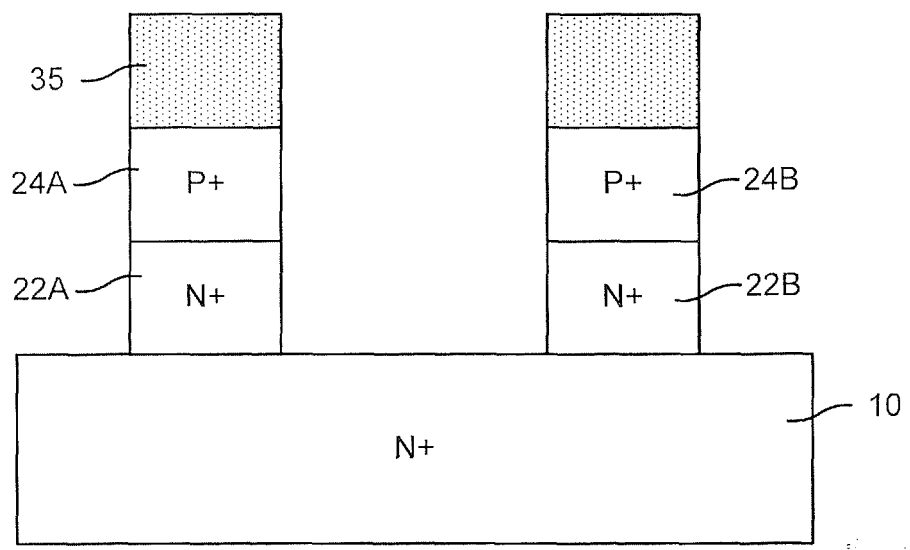

Referring to FIG. 8B, an etch mask 35, which may comprise aluminum, may be formed on the p-type epitaxial layer 24. The p-type epitaxial layer 24 and the n-type epitaxial layer 22 are then anisotropically etched to form mesas including n-type layers 22A, 22B and p-type layers 24A, 24B that respectively define Zener diodes 20A, 20B. Anisotropic etching of silicon carbide is well known in the art, and can be performed, for example, by dry etching the silicon carbide with a fluorine chemistry using an inductively coupled plasma (ICP) or reactive ion etch. The Zener diodes 20A, 20B can have junction areas of about 2500 µm² to about 250,000 µm² or more.

Figure 8C:
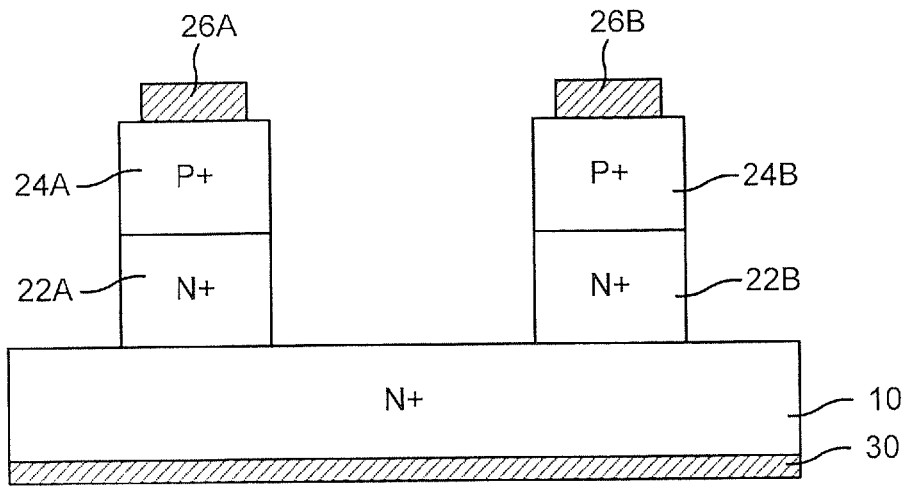

Referring to FIG. 8C, ohmic contacts 26A, 26B are formed on the p-type layers 24A, 24B, respectively. The ohmic contacts 26A, 26B may comprise, for example, nickel, or nickel/aluminum, and may be annealed at a temperature of 775° C. for two minutes. Formation of low resistance ohmic contacts to heavily doped silicon carbide layers is well known in the art.

Following mesa formation, a carrier substrate (not shown) may be affixed to the structure, and the substrate 10A may be thinned to form a thinned substrate 10. The carrier substrate may include a rigid material, such as silicon, alumina, sapphire, etc., and may be affixed using, for example, an adhesive film. The substrate 10A may be thinned to form a substrate 10 having a thickness of less than about 400 µm. In some embodiments, the substrate 10 can have a thickness of less than 200 µm. In some embodiments, the substrate 10 can have a thickness of less than 100 µm, and in some embodiments the substrate 10 can have a thickness of 10 µm. Thinning of the substrate may be performed, for example, by etching and/or mechanically grinding, polishing or lapping the substrate until it has the desired thickness. A backside ohmic contact 30 may then be formed, for example, via laser annealing as described in U.S. Publication No. 2008/0311736, Dec. 18, 2008, the disclosure of which is incorporated herein by reference.

Figure 8D:
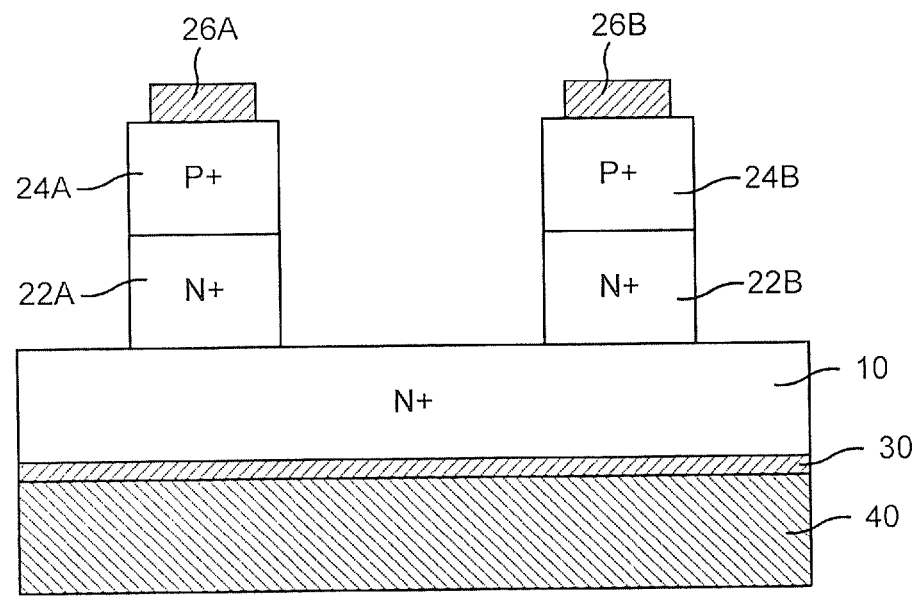

Finally, referring to FIG. 8D, a backside metallization 40 may be formed on the substrate 10. The backside metallization may include, for example, a multilayer structure of Ti/TiW/Au including 1000 Å of Ti, 1000 Å of TiW, and 10,000 Å of Au. The backside metallization 40 can be formed on the substrate 10 by sputtering, for example. The TVS device 100 may be conductively mounted, for example, to a metal submount or metal can, using the backside metallization 40.

Figure 9:
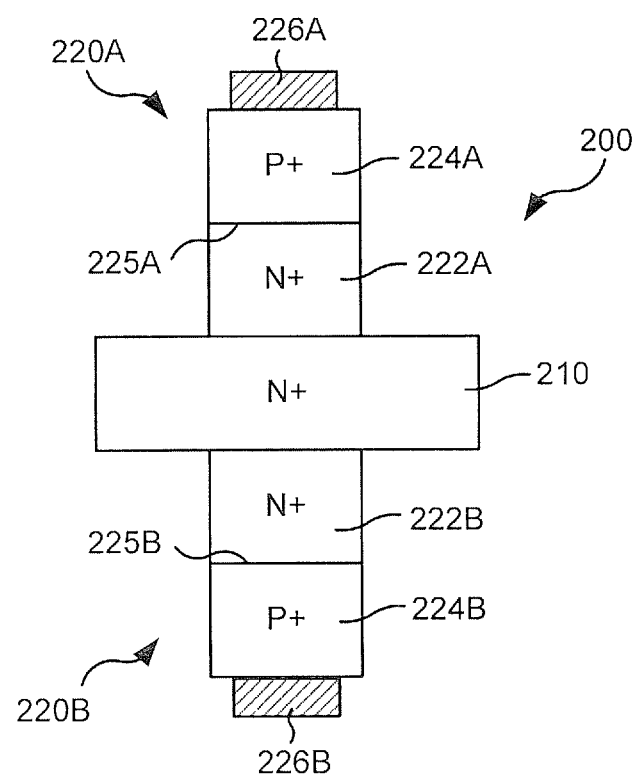
FIG. 9 is a schematic cross-sectional drawing illustrating a bidirectional transient voltage suppression device according to further embodiments.

FIG. 9 illustrates a bidirectional silicon carbide based transient voltage suppression (TVS) device 200 according to further embodiments. The silicon carbide based TVS device 200 illustrated in FIG. 9 includes an n+ silicon carbide base layer 210, which may include a 4H—SiC bulk substrate. A pair of Zener diode mesas 220A, 220B are formed on opposite sides of the based layer 210. The Zener diode mesas 220A, 220B include respective n+ layers 222A, 222B on the base layer 210 and p+ layers 224A, 224B on the respective n+ layers 222A, 222B, defining Zener junctions 225A, 225B therebetween. Ohmic contacts 226A, 226B are formed on the p+ layers 224A, 224B, respectively. The silicon carbide base layer 210 may be thinned to a thickness of less than 200 μm, thereby reducing the Zener impedance of the device. The doping ranges and thicknesses of the silicon carbide base layer 210 and the n+ layers 222A, 222B and p+ layers 224A, 224B, may be similar to those of the corresponding layers in the device illustrated in FIG. 1.

Figure 10:
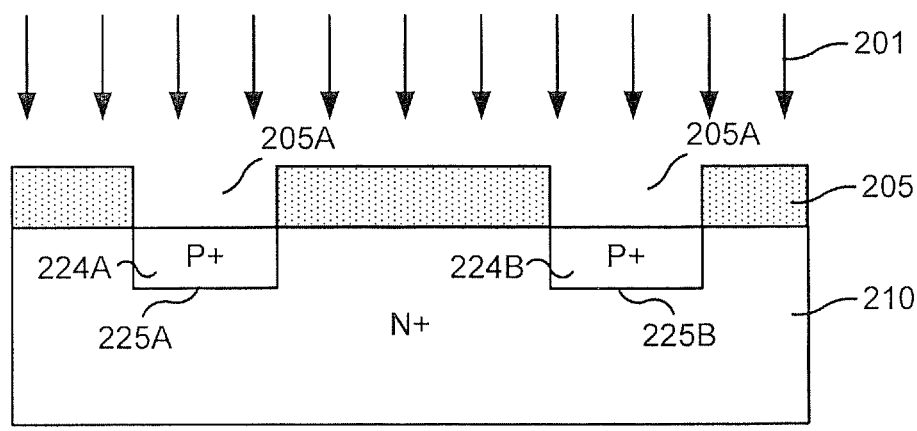
FIG. 10 is a schematic cross-sectional drawing illustrating methods of forming bidirectional transient voltage suppression devices according to further embodiments.

FIG. 10 is a schematic cross-sectional drawing illustrating methods of forming bidirectional transient voltage suppression devices according to further embodiments. In particular, a bidirectional transient voltage suppression device according to some embodiments can be formed using ion implantation. Referring to FIG. 10, an n+ silicon carbide layer 210 is provided. The n+ silicon carbide layer 210 can include 4H—SiC, although other polytypes of SiC, such as 6H, 3C or 15R can be used. In some embodiments, the n+ silicon carbide layer 210 may include bulk silicon carbide. However, in other embodiments, the n+ silicon carbide layer 210 can include epitaxial silicon carbide.

An implant mask 205 including a pair of openings 205A, 205B is Formed on the silicon carbide layer 210, and p-type dopants, such as aluminum, are selectively implanted into the silicon carbide layer 210 to form p+ regions 224A, 224B.

The p+ regions 224A, 224B may be implanted with sufficient p-type dopants to cause the p+ regions 224A, 224B to form Zener junctions 225A, 225B with the n+ silicon carbide layer 210, thereby defining respective Zener diodes 220A, 220B. In particular, the p+ regions 224A, 224B may be doped to have a net p-type dopant concentration of $1 \times 10^{19}$ cm$^{-3}$ or more. In some embodiments, the p+ regions 224A, 224B may have a net p-type doping concentration of $5 \times 10^{19}$ cm$^{-3}$ or greater, and in some embodiments may have a net p-type doping concentration of about $1 \times 10^{20}$ cm$^{-3}$.

Suitable doping profiles can be obtained by implanting aluminum ions into a 4H—SiC layer according to one or more of the implant schedules shown in Tables 1 and 2 below. Table 1 describes an implant schedule for obtaining a box profile of aluminum ions in 4H—SiC having a doping concentration of about $1 \times 10^{19}$ cm$^{-3}$, while Table 2 describes an implant schedule for obtaining a box profile of aluminum ions in 4H—SiC having a doping concentration of about $5 \times 10^{18}$ cm$^{-3}$.

TABLE 1

$1 \times 10^{19}$ cm$^{-3}$ concentration, Implant 27Al+

| Dose (cm$^{-2}$) | Energy (keV) |
|---|---|
| $3 \times 10^{13}$ | 30 |
| $5 \times 10^{13}$ | 65 |
| $8.5 \times 10^{13}$ | 125 |
| $1.2 \times 10^{14}$ | 220 |

TABLE 2

$5 \times 10^{18}$ cm$^{-3}$ concentration, Implant 27Al+

| Dose (cm$^{-2}$) | Energy (keV) |
|---|---|
| $1.5 \times 10^{13}$ | 30 |
| $2.5 \times 10^{13}$ | 65 |
| $4.5 \times 10^{13}$ | 125 |
| $7 \times 10^{13}$ | 220 |

Implantation may be performed at an elevated temperature, such as about 650° C. to improve crystal quality. Following implantation, an activation anneal is performed in non-oxidizing ambient, such as argon, at a temperature of about 1500° C. to about 2200° C. for a duration of 1 min to 1 hours. In some embodiments, the implants can be annealed at a temperature of 1650° C. for 5-30 min.

In some cases, Zener characteristics may be obtained once the p-type doping concentration exceeds about $5 \times 10^{19}$ cm$^{-3}$ (i.e., 5× the implant schedule shown in Table 1). The resulting structure may be have a very thin intrinsic (i) layer between the p+ regions 224A, 224B and the silicon carbide layer 210, and therefore may exhibit a mix of avalanche and Zener breakdown characteristics. The device may still function effectively as a transient voltage suppressor, however.

Figure 11A:
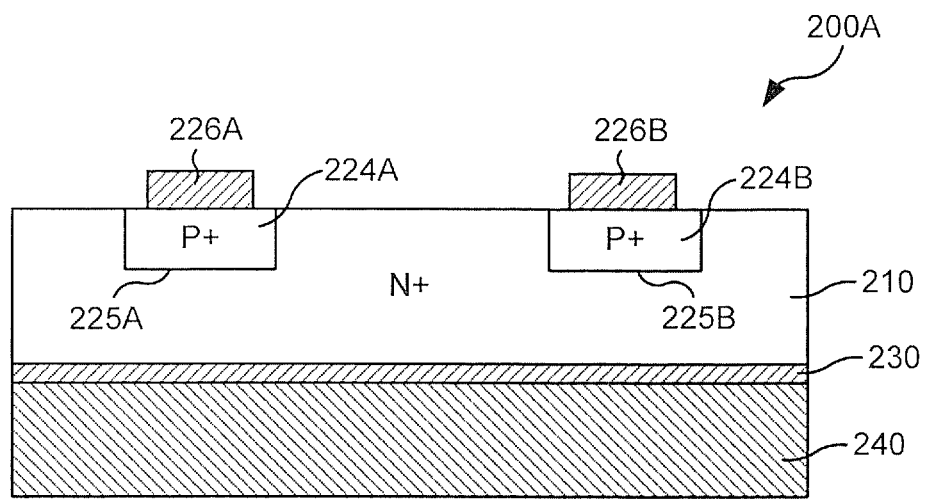
FIGS. 11A and 11B are schematic cross-sectional drawings illustrating bidirectional transient voltage suppression devices according to further embodiments.
Figure 11B:
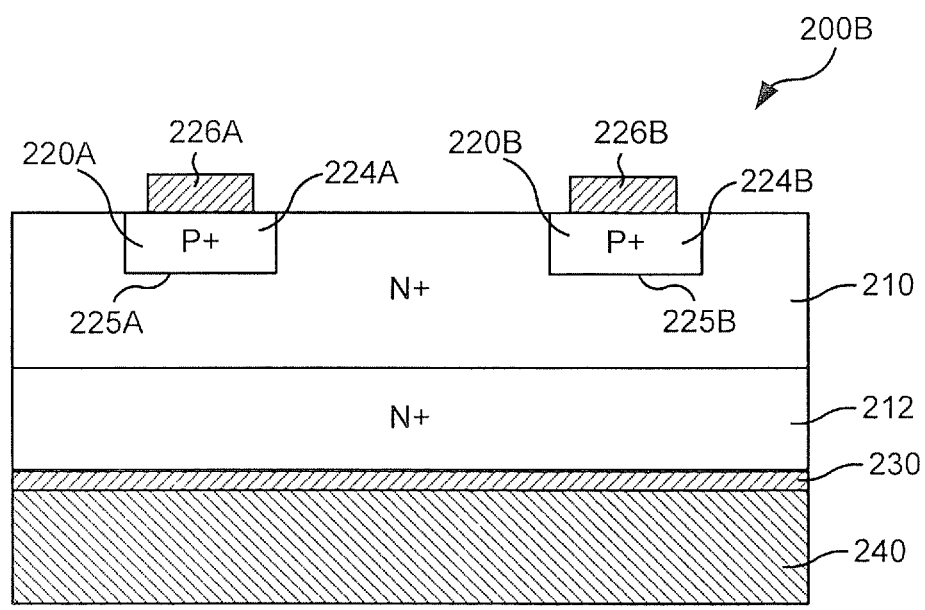

FIGS. 11A and 11B are schematic cross-sectional drawing illustrating bidirectional transient voltage suppression devices 200A, 200B according to further embodiments. The TVS devices 200A, 200B are similar except that in the TVS device 200A of FIG. 11A, the silicon carbide layer 210 is a bulk substrate of silicon carbide, while in the TVS device 200B of FIG. 11B, the silicon carbide layer 210 is an epitaxial layer of silicon carbide on a bulk substrate 212 of silicon carbide.

Referring to FIGS. 11A and 11B, after implantation and activation of the p-type regions 224A, 224B, respective ohmic contacts 226A, 226B are formed on the p+ regions 224A, 224B. Furthermore, an ohmic contact 230 is formed on the silicon carbide layer 210 and/or the substrate 212 opposite the p+ regions 224A, 224B. A backside metallization 240 including, for example, a Ti/TiW/Au structure, can be formed on the ohmic contact 230.

In some embodiments, the silicon carbide layer 210 and/or the substrate 212 can have a thickness of less than about 400 μm. In some embodiments, the substrate 212 can be thinned to a thickness of less than 200 μm. In some embodiments, the substrate 212 can be thinned to a thickness of less than 100 μm, and in some embodiments the substrate 212 can be thinned to a thickness of 10 μm. The substrate 212 can be thinned, for example, by mechanical polishing, grinding, etching, and/or a combination thereof. In some embodiments, the substrate 212 can be thinned prior to formation of the ohmic contact 230 thereon.

Embodiments of the invention have been set forth in the drawings and specification, and although specific terms have been employed, they are used in a generic and descriptive That which is claimed is:

1. A bidirectional transient voltage suppression device, comprising:
   a silicon carbide layer having a first conductivity type and having a first surface and a second surface opposite the first surface; and
   first and second silicon carbide diodes on the silicon carbide layer, wherein each of the first and second silicon carbide diodes includes a first heavily doped silicon carbide layer having a second conductivity type opposite the first conductivity type, a second heavily doped silicon carbide layer having the first conductivity type, and an ohmic contact on the first heavily doped silicon carbide layer, wherein the silicon carbide layer is electrically connected to the first and second silicon carbide diodes and provides a common reference for the first and second silicon carbide diodes,
   wherein the second heavily doped silicon carbide layer is between the silicon carbide layer and the first heavily doped silicon carbide layer,
   wherein the first and second silicon carbide diodes comprise mesas on the silicon carbide layer, and
   wherein the mesas include the first heavily doped silicon carbide layer and the second heavily doped silicon carbide layer.

2. The bidirectional transient voltage suppression device of claim 1, wherein the silicon carbide layer has a thickness less than about 200 μm.

3. The bidirectional transient voltage suppression device of claim 1, wherein the silicon carbide layer has a doping concentration of about $5 \times 10^{18}$ cm$^{-3}$ or more.

4. The bidirectional transient voltage suppression device of claim 1, wherein the first heavily doped silicon carbide layers are p-type with a doping concentration of about $5 \times 10^{18}$ cm$^{-3}$ or more.

5. The bidirectional transient voltage suppression device of claim 1,
   wherein the second heavily doped silicon carbide layers form a respective Zener junction with the first heavily doped silicon carbide layer.

6. The bidirectional transient voltage suppression device of claim 5, wherein the second heavily doped silicon carbide layer is n-type with a doping concentration of about $1 \times 10^{19}$ cm$^{-3}$ or more.

7. The bidirectional transient voltage suppression device of claim 1, further comprising an ohmic contact layer on the silicon carbide layer opposite the first and second silicon carbide diodes.

8. The bidirectional transient voltage suppression device of claim 1, wherein at least one of the first heavily doped silicon carbide layers has an increased doping concentration near the ohmic contact thereon.

9. The bidirectional transient voltage suppression device of claim 1, wherein the first heavily doped silicon carbide layers comprise first heavily doped silicon carbide epitaxial layers on the silicon carbide layer.

10. The bidirectional transient voltage suppression device of claim 9, wherein the silicon carbide layer comprises an epitaxial silicon carbide layer.

11. The bidirectional transient voltage suppression device of claim 10, wherein the mesas extend completely through the first heavily doped silicon carbide epitaxial layers and into but not completely through the silicon carbide layer.

12. The bidirectional transient voltage suppression device of claim 10, wherein the mesas extend completely through the first heavily doped silicon carbide epitaxial layers and completely through the silicon carbide layer.

13. The bidirectional transient voltage suppression device of claim 1, wherein the mesas each have a cross sectional area of about 0.25 mm$^2$ or more.

14. The bidirectional transient voltage suppression device of claim 1, wherein the silicon carbide layer comprises a bulk silicon carbide substrate, and wherein the mesas extend completely through the first heavily doped silicon carbide layers and into the silicon carbide substrate.

15. The bidirectional transient voltage suppression device of claim 1, wherein each of the first and second diodes has a breakdown voltage that is less than 20V.

16. The bidirectional transient voltage suppression device of claim 1, wherein each of the first and second diodes has a negative breakdown voltage temperature coefficient.

17. The bidirectional transient voltage suppression device of claim 1, wherein the first and second silicon carbide diodes comprise Zener diodes.

18. A bidirectional transient voltage suppression device, comprising:
   a silicon carbide layer having a first conductivity type and having a first surface and a second surface opposite the first surface;
   first and second silicon carbide diodes on the silicon carbide layer, wherein each of the first and second silicon carbide diodes comprises a first heavily doped silicon carbide epitaxial layer having a second conductivity type opposite the first conductivity type, and a second heavily doped silicon carbide epitaxial layer having the first conductivity type,
   wherein the silicon carbide layer is conductively connected to the first and second silicon carbide diodes and provides a common reference for the first and second silicon carbide diodes, and
   first and second ohmic contacts, respectively, on the heavily doped silicon carbide epitaxial layers of the first and second silicon carbide diodes opposite the silicon carbide layer,
   wherein the first and second silicon carbide diodes comprise mesas on the silicon carbide layer, and
   wherein the mesas include the first heavily doped silicon carbide epitaxial layer and the second heavily doped silicon carbide epitaxial layer.

19. The bidirectional transient voltage suppression device of claim 18, wherein each of the first and second diodes has a breakdown voltage that is less than 20V.

20. The bidirectional transient voltage suppression device of claim 18, wherein the first and second silicon carbide diodes comprise Zener diodes.

* * * * *